United States Patent [19]
Gardner et al.

[11] Patent Number: 5,970,347
[45] Date of Patent: *Oct. 19, 1999

[54] HIGH PERFORMANCE MOSFET TRANSISTOR FABRICATION TECHNIQUE

[75] Inventors: Mark I. Gardner, Cedar Creek; H. Jim Fulford, Jr., Austin, both of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/896,400

[22] Filed: Jul. 18, 1997

[51] Int. Cl.$^6$ .................................................. H01L 21/336
[52] U.S. Cl. .................... 438/286; 438/275; 438/299; 438/305; 438/306; 438/307; 438/516; 257/336; 257/344; 257/408
[58] Field of Search ................................. 257/408, 336, 257/344; 438/197, 286, 275, 299, 301, 305, 306, 307, 516

[56] References Cited

U.S. PATENT DOCUMENTS

| | | | |
|---|---|---|---|
| 4,755,865 | 7/1988 | Wilson et al. | 257/387 |
| 4,774,197 | 9/1988 | Haddad et al. | 438/585 |
| 4,947,228 | 8/1990 | Gabara | 257/369 |
| 5,451,807 | 9/1995 | Fujita | 257/408 |
| 5,756,381 | 5/1998 | Buynoski | 257/408 |

OTHER PUBLICATIONS

T. Kuroi et al., "Novel NICE (Nitrogen Implantation into CMOS Gate Electrode and Source–Drain) Structure for High Reliability and High Performance 0.25 micron Dual Gate CMOS" IEDM 93 (1993) pp. 325–328.

S. M. Sze, Semiconductor Devices Physics and Technology, John Wiley & Sons (New York) 1985 pp. 38, 351–2.

*Primary Examiner*—Wael M. Fahmy
*Assistant Examiner*—Long Pham
*Attorney, Agent, or Firm*—Conley, Rose & Tayon; Robert C. Kowert; Kevin L. Daffer

[57] ABSTRACT

A semiconductor fabrication process in which nitrogen is incorporated into the transistor gate without significantly increasing the resistivity of the source/drain region. The incorporation of nitrogen into the gate structure substantially reduces the migration of impurity dopants from the silicon gate into the transistor channel region resulting in a more stable and reliable transistor. In one embodiment, a tail of the nitrogen impurity distribution incorporated into the gate structure extends into the channel region of the semiconductor substrate. In this embodiment, the nitrogen within the channel region prevents excessive lateral diffusion of source/drain impurities thereby permitting the fabrication of deep sub-micron transistors.

14 Claims, 3 Drawing Sheets

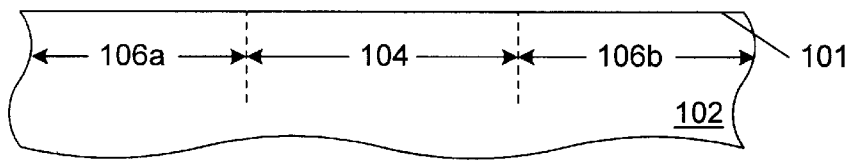
FIG. 1
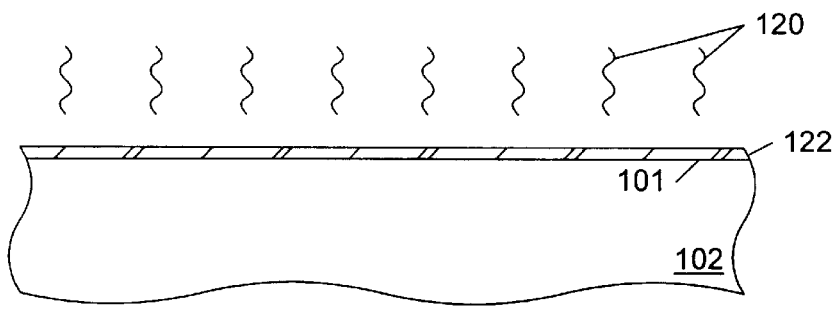
FIG. 2
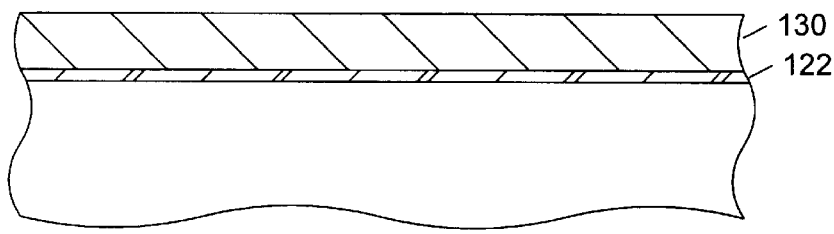
FIG. 3
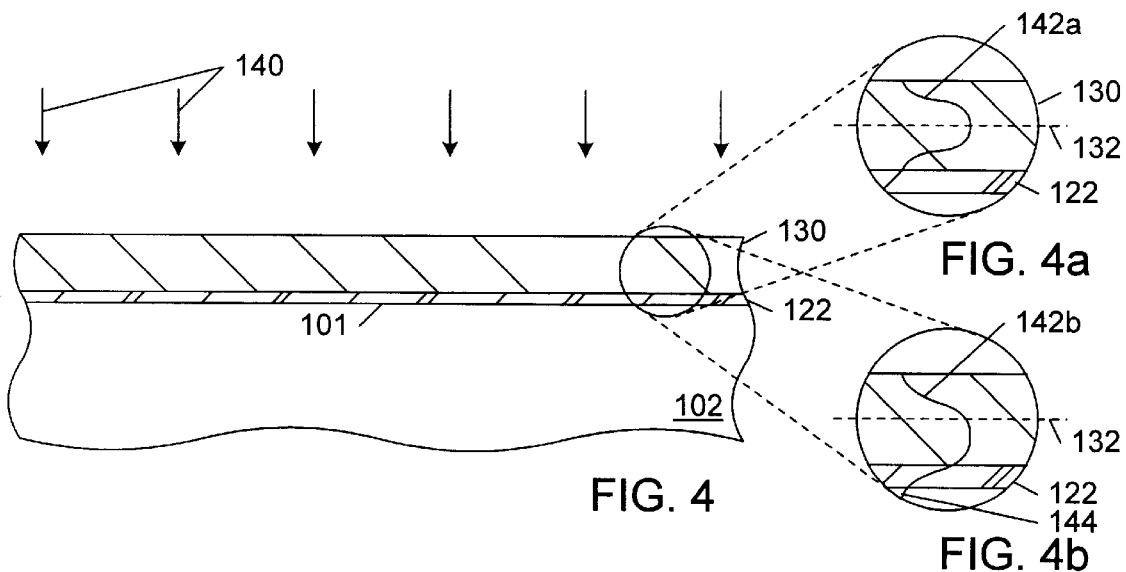
FIG. 4
FIG. 4a
FIG. 4b

HIGH PERFORMANCE MOSFET TRANSISTOR FABRICATION TECHNIQUE

BACKGROUND OF THE INVENTION

1. Field of the Invention

The present invention relates to the field of semiconductor processing and more particularly to a transistor fabrication technique in which nitrogen is incorporated into the silicon gate to provide an advantageous impurity barrier without significantly degrading the transistor performance.

2. Description of the Relevant Art

The conventional fabrication of MOS (metal-oxide-semiconductor) transistors within a semiconductor substrate is well known. Typically, the substrate is divided into a plurality of active regions and isolation regions through an isolation process such as field oxidation or shallow trench isolation. After the isolation and active regions have been formed, the active regions may be further divided into n-well active regions and p-well active regions by implanting n-type dopants and p-type dopants into their respective wells. A thin oxide is then grown on an upper surface of the semiconductor substrate in the active regions. This thin oxide serves as the gate oxide for subsequently formed transistors. Thereafter, a plurality of polysilicon gate structures are formed wherein each polysilicon gate traverses an active region effectively dividing the active region into a pair of source/drain regions disposed on either side of each gate structure and a channel region disposed below each gate structure. After formation of the polysilicon gates, a p-type source/drain implant is performed to introduce p-type impurities into the source/drain regions of the n-wells and an n-type source/drain implant is performed to introduce n-type impurities into the source/drain regions of the p-wells. The dopant species used in conventional transistor processing typically include phosphorus and arsenic for n-type impurities and boron for p-type impurities.

As transistor geometries shrink below 0.5 micron, the limitations of conventional transistor processing become more and more apparent. As the thickness of the gate oxide decreases below 100 angstroms, devices become more susceptible to diffusion of impurities contained within the gate structure across the gate oxide and into the active area of the transistor. This problem is especially acute for gate structures into which boron is implanted (e.g., p+ polysilicon gates) because of the relatively high rate at which boron diffuses through silicon and silicon dioxide. In addition, it is believed that many loosely formed bonds exist at the interface between the gate oxide structure and the polysilicon gate structure in conventionally formed transistors. The presence of these loosely formed bonds is believed to contribute to undesirable transistor characteristics such as susceptibility to voltage breakdown. Still further, as devices become smaller and more densely packed upon a semiconductor substrate surface, it becomes increasingly important to minimize the leakage current of each individual transistor. It is believed that leakage current can be created by a scattering effect that occurs as electrons traverse the channel between a device's source region and drain region. As the number of transistor devices within a single integrated circuit increases, leakage current can become significant enough to raise the temperature of the semiconductor substrate slowing the device and, eventually, raising the temperature above the operational limit of the device.

Therefore, it would be highly desirable to fabricate MOS transistors in a manner that reduced or eliminated diffusion from a gate structure to an underlying active region of the transistor, improved the bond structure of the polysilicon gate oxide interface thereby improving the characteristics of the interface, and increased the source/drain drive current without a corresponding increase in leakage current. It would be further desirable if the fabrication technique selected also facilitated the producing of deep sub-micron transistor channel lengths. In the sub-micron region, the short transistor channels can be rendered effectively non-functional if the source/drain impurities diffuse laterally through the channel. Accordingly, it would be beneficial if the fabrication technique selected limited or prevented lateral substantial diffusion of source/drain impurity distributions thereby reducing concerns over post source/drain high temperature processing. It would be further desirable if the selected fabrication technique did not result in an undue increase in the sheet resistivity of the source/drain regions.

SUMMARY OF THE INVENTION

The problems identified above are in large part addressed by a semiconductor fabrication process in which nitrogen is advantageously incorporated into the transistor gate without significantly increasing the resistivity of the source/drain region. The incorporation of nitrogen into the gate structure substantially reduces the migration of impurity dopants from the silicon gate into the transistor channel region resulting in a more stable and reliable transistor. In one embodiment, a tail of the nitrogen impurity distribution incorporated into the gate structure extends into the channel region of the semiconductor substrate. In this embodiment, the nitrogen within the channel region prevents excessive lateral diffusion of source/drain impurities thereby facilitating the fabrication of deep subquarter micron transistors.

Broadly speaking, the present invention contemplates a semiconductor process in which a gate dielectric is formed on an upper surface of a semiconductor substrate. A conductive layer is then deposited on the gate dielectric and a nitrogen bearing impurity distribution is introduced into the conductive layer, preferably with an implant process. The conductive layer is then patterned to produce a conductive gate structure. The conductive gate structure is aligned over a channel region of the semiconductor substrate. A first source/drain impurity distribution is then implanted into the substrate. The conductive gate structure acts as an implant mask during this implant such that the first impurity distribution is self aligned to the conductive gate structure within the substrate. In this manner, the first source/drain impurity distribution is laterally disposed on either side of the channel region. The semiconductor substrate is preferably comprised of a single crystal silicon wafer in which a p-type epitaxial layer is formed on a p+ silicon bulk. A resistivity of the epitaxial layer is preferably in the range of approximately 10 to 15 $\Omega$-cm. The formation of the gate dielectric layer is suitably accomplished with a thermal oxidation process in which the substrate is immersed in an oxygen bearing ambient maintained at a temperature in the range of approximately 500°–900° C. The implantation of the nitrogen bearing impurity distribution is accomplished in one embodiment such that a peak impurity concentration of the nitrogen impurity distribution is located at a depth below a mid-point in the conductive gate layer and such that a lower tail of the nitrogen impurity distribution extends within an upper region of the semiconductor substrate. In an alternative embodiment in which it is desirable to substantially prevent nitrogen from entering the semiconductor substrate, the implantation of the nitrogen bearing impurity distribution is accomplished such that a peak concentration of the impurity distribution is located at or above the conductive gate layer mid-point.

The implant dose for the first source/drain impurity distribution is preferably less than approximately $\times 10^{15}$ atoms/$cm^2$. In one embodiment, the process further includes the formation of a drain mask over an LDD region and a drain region of the semiconductor substrate. In this embodiment, the LDD region is laterally disposed between the drain region and the channel region of the semiconductor substrate. A source impurity distribution is then implanted into the substrate wherein the source impurity distribution is aligned with the exposed sidewall of the conductive gate structure. The drain mask substantially excludes the source impurity distribution from entering the channel region, the LDD region, and the drain region of the semiconductor substrate. The drain mask is then removed and spacer structures are formed on respective sidewalls of the conductive gate structure. The spacer structures mask a region of the substrate upper surface proximal to and laterally disposed on either side of the channel region including the LDD region. A drain impurity distribution is then implanted into the substrate. The conductive gate structure and the spacer structures mask the drain impurity distribution so that the drain impurity distribution is substantially excluded from the channel region and the LDD region of the substrate. The drain mask is preferably comprised of a photoresist and an implant dose for the source impurity distribution is preferably in the range of approximately $1 \times 10^{15}$ to $7 \times 10^{15}$ atoms/$cm^2$. An implant dose for the drain impurity distribution is typically greater than approximately $1 \times 10^{15}$ atoms/$cm^2$.

The present invention further contemplates a semiconductor transistor and an integrated circuit. The transistor includes a semiconductor substrate, a gate dielectric, a conductive gate structure, and a first source/drain impurity distribution. The gate dielectric is formed on an upper surface of the substrate and the conductive gate structure is formed on the gate dielectric. The conductive gate structure is aligned over a channel region of the semiconductor substrate and includes a nitrogen bearing impurity distribution. The first source/drain impurity distribution resides within the semiconductor substrate self-aligned to the conductive gate structure such that the impurity distribution is laterally displaced on either side of the channel region. In a presently preferred embodiment, the conductive gate structure is comprised of polysilicon. A peak concentration of the nitrogen bearing impurity distribution is preferably in excess of approximately $1 \times 10^{19}$ atoms/$cm^3$. In one embodiment, a peak concentration of the nitrogen bearing impurity distribution is located below a mid-point of the conductive gate structure. A tail of the impurity distribution in this embodiment extends into the channel region of the semiconductor substrate.

BRIEF DESCRIPTION OF THE DRAWINGS

Other objects and advantages of the invention will become apparent upon reading the following detailed description and upon reference to the accompanying drawings in which:

FIG. 1 is a partial cross-sectional view of a semiconductor substrate;

FIG. 2 is a processing step subsequent to FIG. 1 in which a gate dielectric is formed on the semiconductor substrate;

FIG. 3 is processing step subsequent to FIG. 2 in which a conductive gate layer is deposited on the gate dielectric layer;

FIGS 4, 4A and 4B are alternative views of a processing step subsequent to FIG. 3 in which a nitrogen bearing impurity distribution is introduced into the conductive gate layer;

Figure 5:
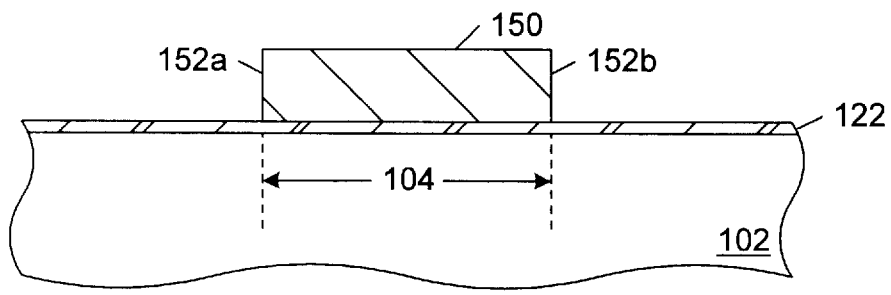
FIG. 5 is a processing step subsequent to FIG. 4 in which the conductive gate layer is patterned to form a conductive gate structure aligned over a channel region of the semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIGS. 1 through 9 show a preferred processing sequence for manufacturing a semiconductor transistor in accordance with the present invention. In FIG. 1, semiconductor substrate 102 is provided. Semiconductor substrate 102 includes a channel region 104 laterally displaced between a pair of source/drain regions 106a and 106b. In a presently preferred embodiment useful for the fabrication of CMOS integrated circuits, semiconductor substrate 102 typically comprises a single crystal silicon wafer in which a p-type epitaxial layer is formed over a p+ silicon bulk. A preferred resistivity of the p-type epitaxial layer is in the range of approximately 10–15 $\Omega$/cm. In CMOS applications, n-type and p-type wells may be formed prior to the processing sequence shown in FIGS. 1 through 9. Accordingly, the portion semiconductor substrate 102 shown in FIGS. 1 through 9 may comprise either a p-type or n-type silicon substrate depending on the conductivity type of the transistor to be formed.

Turning now to FIG. 2, a dielectric layer 122 is formed on upper surface 101 of semiconductor substrate 102. Preferably, dielectric layer 122 comprises a thermally grown silicon oxide film suitably formed by immersing semiconductor substrate 102 in an oxygen bearing ambient maintained at a temperature in the range of approximately 500° to 900° C. The thermal oxidation process may be carried out using a batch process such as a oxidation furnace, or alternatively, using a rapid thermal apparatus. A preferred thickness of gate dielectric layer 122 is in the range of approximately 15 to 100 angstroms. The thermal oxidation process is represented in FIG. 2 by reference numeral 120.

Turning now to FIG. 3, a conductive gate layer 130 is fabricated on an upper surface of gate dielectric layer 122. In one presently preferred embodiment, the formation of conductive gate layer 130 is accomplished by thermally decomposing silane in a chemical vapor deposition reactor chamber maintained at a temperature in the range of approximately 580° to 650° C. To reduce the inherently high resistivity of a deposited polysilicon film, conductive gate layer 130 is typically doped with an appropriate impurity such as boron, arsenic, or tungsten. The impurity distribution may suitably be introduced into conductive gate layer 130 with an ion implant, a diffusion process, or in situ during the deposition of conductive gate layer 130. In a presently preferred embodiment, an implant dose ion implantation process is used to introduce an impurity distribution into conductive gate layer 130 to reduce the sheet resistivity of conductive gate layer 130 to less than approximately 500 Ω/square.

Turning now to FIG. 4, a nitrogen bearing impurity distribution (represented in FIGS. 4a and 4b by reference numerals 142a and 142b respectively) is introduced into conductive gate layer 130 preferably through the use of an ion implantation process represented in FIG. 4 by reference numeral 140. The incorporation of a nitrogen species into the conductive gate layer of a MOS transistor beneficially provides a barrier to impurity diffusion. An impurity barrier is desirable to minimize or substantially prevent migration of impurities located within conductive gate layer 130 across gate dielectric layer 122 and into channel region 104 of semiconductor substrate 102 where the impurities may cause long term threshold voltage instability. In the present invention, it is desirable to incorporate the nitrogen into the conductive gate layer 130 prior to patterning the conductive gate layer 130 to prevent significant nitrogen doping of semiconductor substrate 102. It is theorized that the introduction of a significant nitrogen distribution into the source/drain regions 106 of semiconductor substrate 102 may undesirably increase the sheet resistivity of the source/drain regions possibly resulting in increased contact resistance to the source/drain regions and degraded transistor performance including possibly a decrease in saturated drain current and an increase in contact resistance possibly resulting in decreased operating speeds.

Referring to FIGS. 4a and 4b, alternative embodiments of the present invention are shown. In FIG. 4a, a peak concentration of the nitrogen impurity distribution is located at or above a mid-point 132 located at approximately half-way between an upper surface of conductive gate layer 130 and an interface between conductive gate layer 130 and gate dielectric layer 122. Consistent with the foregoing comments regarding minimizing the nitrogen doping of source/drain regions 106 of semiconductor substrate 102, this embodiment of the present invention introduces a nitrogen impurity distribution in which the distribution lower tail is located above an interface between conductive gate 132 and dielectric layer 122. (The nitrogen impurity distribution is represented in FIGS. 4a and 4b by the well known bell curves 142a and 142b which indicate the impurity concentration of the nitrogen impurity distribution as a function of the vertical position within conductive gate layer 130.) In the embodiment shown in FIG. 4b, the ion implantation process 140 is adjusted such that a peak impurity concentration of nitrogen impurity distribution 142 is located below midpoint 132 of conductive gate layer 130. In this embodiment, as seen in FIG. 4b, a lower tail of the nitrogen impurity distribution (represented in FIG. 4b by reference numeral 144) extends across gate dielectric layer 122 and into an upper region of semiconductor substrate 102. Notwithstanding the desire to avoid excessive nitrogen doping of semiconductor substrate 102 for the reasons mentioned above, this embodiment of the present invention contemplates that a relatively light concentration of nitrogen within channel region 104 of semiconductor substrate 102 is beneficial. It is theorized that a relatively light nitrogen concentration within channel region 104 is particularly useful in deep submicron p-channel transistors to prevent significant lateral redistribution of the p-type LDD regions during any post source/drain formation high temperature processing such as an anneal cycle typically required to activate the impurities within the source/drain distribution. By providing a barrier to impurity migration, a nitrogen distribution within channel region 104 minimizes boron redistribution thereby permitting the fabrication of extremely short (i.e., less than 0.25 microns) channel lengths. It is further theorized that a relatively light nitrogen concentration may beneficially improve the long term reliability and performance of subquarter micron n-channel transistors as well. In alternative embodiments, the nitrogen implant may be preceded by a masking step in which only the p-channel areas of the substrate 102 are exposed during the implants. In a presently preferred embodiment, an implant dose used for ion implantation 140 is in the range of $10^{14}$ to $10^{15}$ atoms/cm$^2$. Appropriate nitrogen bearing species include $N_2$, $N_2O$, NO, or other appropriate nitrogen bearing compound. In the embodiment of the invention depicted in FIG. 4b, the peak impurity concentration is ideally located within approximately 500 angstroms of an interface between conductive gate layer 130 and gate dielectric layer 122. Preferably, the lower tail 144 of nitrogen impurity distribution 142 as shown in FIG. 44b has a concentration less than or equal to approximately 20% of the peak concentration of impurity distribution 142b and extends to a depth below upper surface 101 of semiconductor substrate 102 less than approximately 400 angstroms.

Turning now to FIG. 5, a conductive gate structure 150 including a pair of sidewalls 152a and 152b is patterned from conductive gate layer 130 using conventional photoresist, photolithography, and plasma etch processing. Conductive gate structure 150 is aligned over channel region 104 of semiconductor substrate 102. Those skilled in the art will recognize that although channel region 104 appears to be defined in FIG. 1, the exact boundaries of channel region 104 are actually defined by the lateral positions of sidewalls 152a and 152b. In other words, no misalignment between conductive gate structure 150 and channel region 104 occurs because the position of conductive gate structure 150 determines the boundary of channel region 104. In the preferred embodiment, a lateral dimension of channel region 104 is in the range of approximately 0.15 to 0.5 microns.

FIGS. 6 through 9 depict a preferred sequence for forming the source and drain structures of the transistor. In this embodiment, an additional masking step is implemented in conjunction with an additional source/drain implant to eliminate the occurrence of a lightly doped region at the source terminal of the transistor. This sequence is preferred in embodiments of the transistors in which the source and drain terminals are dedicated during normal operation. In a dedicated transistor, it is presumed that the source terminal is maintained at ground potential and, therefore, that concerns about hot electron injection and other short channel effects proximal to the source terminal are substantially reduced or entirely eliminated. Under these circumstances, it is considered undesirable to include a lightly doped region in series with a heavily doped region at the grounded terminal because the increased series resistance of the lightly doped region will unnecessarily limit the saturated drain current thereby reducing the overall performance of the integrated circuit. It will be appreciated to those skilled in the art that the processing steps represented in FIG. 7 may be omitted thereby resulting in the fabrication of a more conventional symmetrical transistor in which each of the source/drain terminals includes a lightly doped structure. In addition to the reduced fabrication complexity associated with eliminating the processing shown in FIG. 7, this embodiment of the present invention may be further desirable when a transistor is designed to act bi-directionally. In one embodiment, selected transistors may recieve the implant shown in FIG. 7 while other transistors within the circuit may be masked entirely by the masking structure 170 (shown in FIG. 7 and explained in greater detail below) to produce a circuit in which selected transistors include dedicated source and drain terminals while other transistors are designed symmetrically to operate in a bi-directional fashion.

Figure 6:
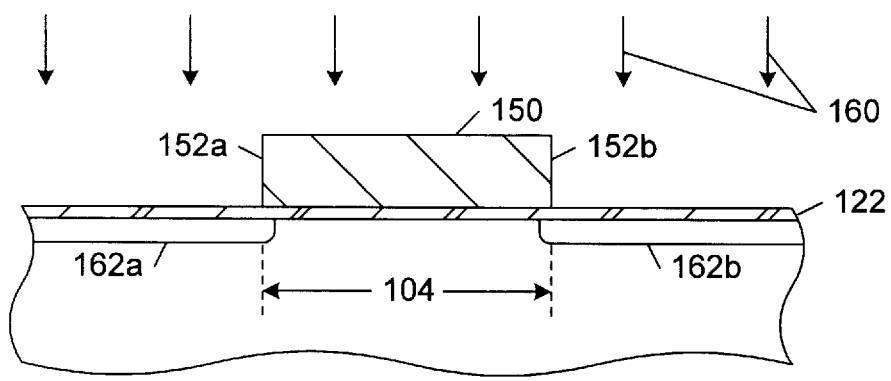
FIG. 6 is a processing step subsequent to FIG. 5 in which a first source/drain impurity distribution is introduced into the semiconductor substrate.

Turning to FIG. 6, a first source/drain impurity distribution 162b is introduced into the source/drain regions 106a and 106b of semiconductor substrate 102 preferably through the use of ion implantation process 160. Conductive gate structure 150 acts as an implant mask during ion implantation 160 such that first source/drain impurity distribution 162a and 162b are self aligned to sidewalls 152a and 152b of conductive gate structure 150. Those familiar with the formation of lightly doped drain (LDD) structures will recognize that the preferred embodiment of the process shown in FIG. 6 is directed at the formation of lightly doped and relatively shallow source/drain regions within semiconductor substrate 102. Accordingly, a preferred implant energy used for the fabrication of first source/drain impurity distributions 162 is in the range of approximately 10 to 50 keV. A suitable implant dose for fabricating lightly doped regions is preferably less than approximately $1\times10^{15}$ atoms/$cm^2$.

Figure 7:
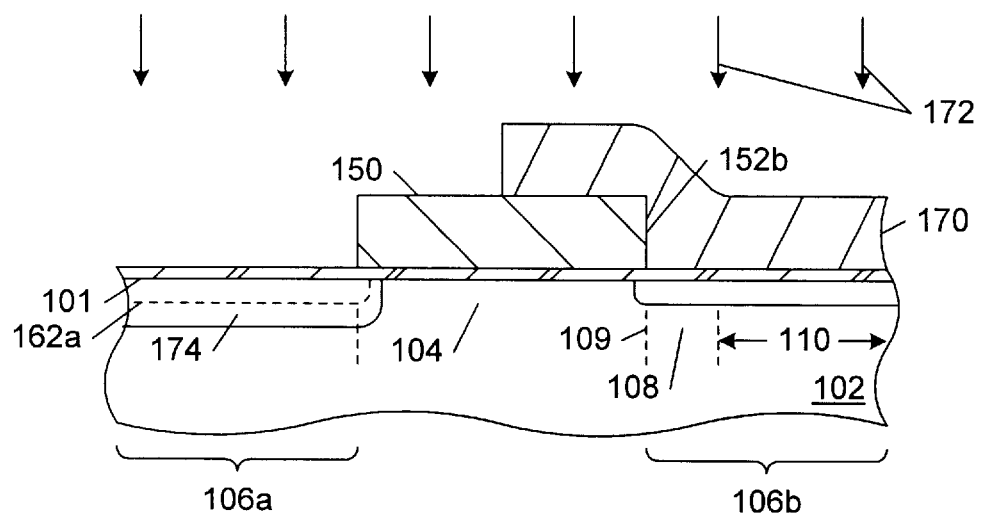
FIG. 7 is a processing step subsequent to FIG. 6 in which a drain mask is formed over an LDD region and a drain region of the semiconductor substrate and a source impurity distribution is introduced into the source region of the substrate.

Turning now to FIG. 7, a drain mask 170 is formed to mask LDD region 108 and drain region 110 of semiconductor substrate 102. As shown in FIG. 7, LDD region 108 is laterally displaced between channel region 104 and drain region 110 of substrate 102. LDD region 108 and drain region 110 comprise source/drain region 106b. Accordingly, a channel-side boundary 109 of LDD region 108 is laterally aligned with sidewall 152b of conductive gate structure 150. After the fabrication of drain mask 170, which is suitably comprised of photoresist patterned using conventional photolithography/photoresist techniques, a source impurity distribution 174 is introduced into first source/drain region 106a of semiconductor substrate 102 preferably through the use of an ion implantation process represented in FIG. 7 by reference numeral 172. In the preferred embodiment, source impurity distribution 174 extends to a greater depth below upper surface 101 than first source/drain impurity distribution 162a. In addition, a peak impurity concentration of source impurity distribution 174 is typically greater than a peak impurity concentration of first source/drain impurity distribution 162. In one embodiment, a suitable dose used for ion implantation process 172 is in the range of approximately $1\times10^{15}$ to $7\times10^{15}$ atoms/$cm^2$. Because the concentration of source impurity distribution 174 is typically considerably greater than the impurity concentration of first source/drain impurity distribution 162, first source/drain impurity distribution 162a is represented in FIG. 7 by the dashed lines intended to indicate that, while present, first source/drain impurity distribution 162a does not significantly contribute to the electrical characteristics within source/drain region 106a. As indicated previously, one embodiment of the present invention contemplates the elimination of the processing shown in and described with respect to FIG. 7 resulting in a final transistor with symmetrical source/drain terminals. Another embodiment contemplates that selected transistors receive ion implantation 172 while other transistors are entirely masked by drain mask 170. This embodiment contemplates an integrated circuit in which both asymmetric and symmetric transistors are fabricated.

Figure 8:
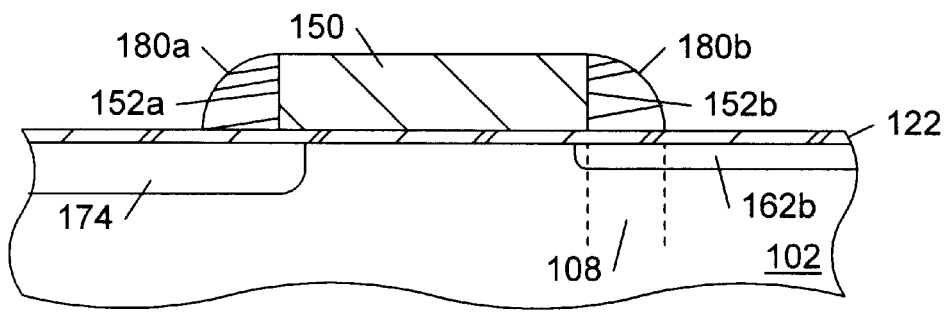
FIG. 8 is a processing step subsequent to FIG. 7 in which the drain mask has been removed and spacer structures formed on sidewalls of the conductive gate structure.

Turning now to FIG. 8, spacer structures 180a and 180b are fabricated on respective sidewalls 152a and 152b of conductive gate structure 150. Spacer structure 180b substantially covers LDD region 108 of semiconductor substrate 102. In a preferred embodiment, the formation of spacer structures 180a and 180b is accomplished by depositing a conformal dielectric layer over the topography defined by substrate 102 and conductive gate structure 150 and thereafter performing an anisotropic etch process with a minimal overetch cycle resulting in the formation of spacer structures of sidewalls of conductive gate structure 150. The preferred method of fabricating the conformal dielectric layer includes plasma enhanced chemical vapor deposition of an oxide layer using a TEOS source within a PECVD reactor chamber maintained at a temperature in the range of approximately 650 to 750° C. and a pressure of less than approximately 2 torr.

Figure 9:
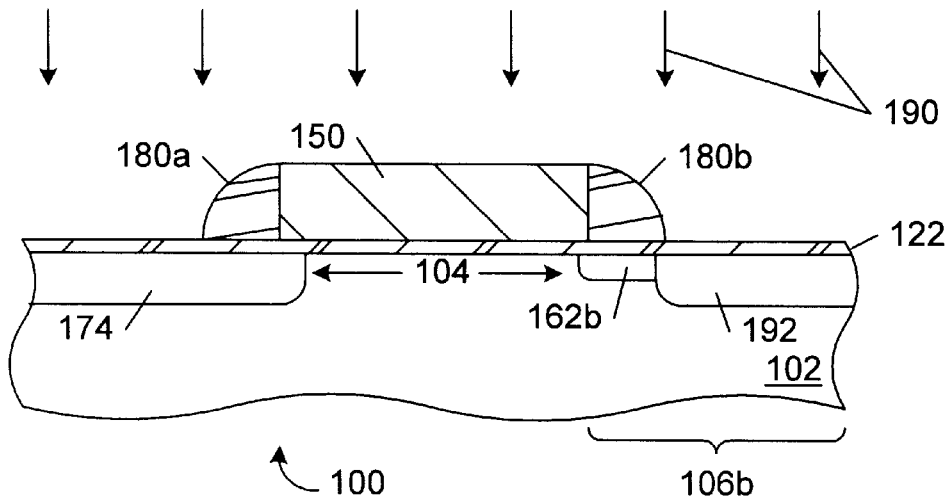
FIG. 9 is a processing step subsequent to FIG. 8 in which a drain impurity distribution is introduced into the semiconductor substrate.

Turning now to FIG. 9, a drain impurity distribution 192 is introduced into semiconductor substrate 102 preferably through the use of an ion implantation process represented in FIG. 9 by reference numeral 190. In the preferred embodiment, drain impurity distribution 192 is fabricated using an implant energy in the range of approximately 10 to 100 keV using an implant dose of greater than approximately $1\times10^{15}$ atoms/$cm^2$. The combination of first source/drain impurity distribution 162b and drain impurity distribution 192 results in a lightly doped drain structure that beneficially reduces the occurrence of hot electron injection by reducing the maximum electric field within channel region 104 proximal to source/drain region 106b when the drain terminal of transistor 100 is biased. The resulting of a transistor 100 which includes the combination of a lightly doped drain and a nitrogenated gate structure provides a mechanism for fabricating reliable transistors in the sub-quarter micron region by minimizing impurity migration and by reducing short channel effects on the drain terminal without unnecessarily increasing the series resistance associated with the source terminal.

Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor process comprising:
   providing a semiconductor substrate;
   forming a gate dielectric layer on an upper surface of said semiconductor substrate;
   depositing a conductive layer on an upper surface of said gate dielectric layer;
   implanting a nitrogen bearing impurity distribution into said conductive layer, wherein said implanting of said nitrogen bearing impurity distribution is accomplished such that a peak impurity concentration of said nitrogen bearing impurity distribution is located at or above a midpoint in said conductive gate layer, and wherein a lower tail of said nitrogen bearing impurity distribution is located within said conductive gate layer whereby said nitrogen bearing impurity distribution is substantially prevented from entering said semiconductor substrate;

subsequent to said implanting a nitrogen bearing impurity distribution, patterning said conductive layer to produce a conductive gate structure, wherein said conductive gate structure is aligned over a channel region of said semiconductor substrate; and simultaneously implanting a first source/drain impurity distribution into said semiconductor substrate wherein said conductive gate structure acts as an implant mask during said implanting whereby said first impurity distribution is laterally disposed on either side of said channel region.

2. The process of claim 1, wherein said semiconductor substrate comprises a single crystal silicon wafer including a p-type epitaxial layer formed on a p+ silicon bulk, wherein a resistivity of said epitaxial layer is in the range of approximately 10 to 15 Ω-cm.

3. The process of claim 1, wherein the step of forming said gate dielectric layer comprises growing a thermal oxide by immersing said semiconductor substrate in an oxygen bearing ambient maintained at a temperature in the range of approximately 500 to 900° C.

4. The process of claim 1, wherein an implant dose for said implanting of said first source/drain impurity distribution is less than approximately $1 \times 10^{15}$ atoms/cm$^2$.

5. The process of claim 1, further comprising:

forming a drain mask over an LDD region and a drain region of said semiconductor substrate, wherein said LDD region is a part of said first source/drain impurity distribution, and wherein said LDD region is laterally disposed between said drain region and said channel region of said semiconductor substrate;

subsequent to said implanting a first source/drain impurity distribution, implanting a source impurity distribution into said semiconductor substrate wherein said source impurity distribution is aligned with said conductive gate structure and further whereby said source impurity distribution is substantially excluded from said channel region, said LDD region, and said drain region of said semiconductor substrate;

removing said drain mask from said semiconductor substrate;

forming spacer structures on respective sidewalls of said conductive gate structure, wherein said spacer structures mask a region of said semiconductor substrate upper surface proximal to said channel region including said LDD region;

implanting a drain impurity distribution into said semiconductor substrate, wherein said conductive gate structure and said spacer structures mask said drain impurity distribution whereby said drain impurity distribution is substantially excluded from said channel region and said LDD region.

6. The process of claim 5, wherein said drain mask comprises photoresist.

7. The process of claim 5, wherein an implant dose for said implanting of said source impurity distribution is in the range of approximately $1 \times 10^{15}$ to $7 \times 10^{15}$ atoms/cm$^2$.

8. The process of claim 5, wherein an implant dose for said implanting of said drain impurity distribution is greater than approximately $1 \times 10^{15}$ atoms/cm$^2$.

9. A semiconductor process comprising:

providing a semiconductor substrate;

forming a gate dielectric layer on an upper surface of said semiconductor substrate;

depositing a conductive layer on an upper surface of said gate dielectric layer;

implanting a nitrogen bearing impurity distribution into said conductive layer;

patterning said conductive layer to produce a conductive gate structure, wherein said conductive gate structure is aligned over a channel region of said semiconductor substrate;

simultaneously implanting a first source/drain impurity distribution into said semiconductor substrate wherein said conductive gate structure acts as an implant mask during said implanting whereby said first source/drain impurity distribution is laterally disposed on either side of said channel region;

forming a drain mask over an LDD region and a drain region of said semiconductor substrate, wherein said LDD region is part of said first source/drain impurity distribution, and wherein said LDD region is laterally disposed between said drain region and said channel region of said semiconductor substrate;

subsequent to said implanting a first source/drain impurity distribution, implanting a source impurity distribution into said semiconductor substrate wherein said source impurity distribution is aligned with said conductive gate structure and further whereby said source impurity distribution is substantially excluded from said channel region, said LDD region, and said drain region of said semiconductor substrate;

removing said drain mask from said semiconductor substrate;

forming spacer structures on respective sidewalls of said conductive gate structure, wherein said spacer structures mask a region of said semiconductor substrate upper surface proximal to said channel region including said LDD region; and implanting a drain impurity distribution into said semiconductor substrate, wherein said conductive gate structure and said spacer structures mask said drain impurity distribution whereby said drain impurity distribution is substantially excluded from said channel region and said LDD region.

10. The process of claim 9, wherein said implanting of said nitrogen bearing impurity distribution is accomplished such that a peak impurity concentration of said nitrogen bearing impurity distribution is located below a midpoint in said conductive gate layer and further wherein a lower tail of said impurity distribution extends within an upper region of said semiconductor substrate.

11. The process of claim 9, wherein said implanting of said nitrogen bearing impurity distribution is accomplished such that a peak impurity concentration of said nitrogen bearing impurity distribution is located at or above a midpoint in said conductive gate layer, and wherein a lower tail of said impurity is located within said conductive gate layer whereby said impurity distribution is substantially prevented from entering said semiconductor substrate.

12. The process of claim 9, wherein an implant dose for said implanting of said first source/drain impurity distribution is less than approximately $1 \times 10^{15}$ atoms/cm$^2$.

13. The process of claim 12, wherein an implant dose for said implanting of said source impurity distribution is in the range of approximately $1 \times 10^{15}$ to $7 \times 10^{15}$ atoms/cm$^2$.

14. The process of claim 13, wherein an implant dose for said implanting of said drain impurity distribution is greater than approximately $1 \times 10^{15}$ atoms/cm$^2$.

* * * * *